United States Patent [19]

Hoehn et al.

[11] Patent Number: 5,492,981
[45] Date of Patent: Feb. 20, 1996

[54] CASTING RESIN OF EPOXYALKYLSILOXANE, EPOXY RESIN AND ANHYRIDE

[75] Inventors: Klaus Hoehn, Taufkirchen; Ulrike Reeh; Ernst Wipfelder, both of Munich; Guenther Waitl, Regensburg, all of Germany

[73] Assignee: Siemens Aktiengesellschaft, Munich, Germany

[21] Appl. No.: 294,943

[22] Filed: Aug. 24, 1994

[30] Foreign Application Priority Data

Aug. 24, 1993 [DE] Germany ............ 43 28 466.3

[51] Int. Cl.$^6$ .............. C08L 63/00; C08L 83/06
[52] U.S. Cl. .............. 525/476; 525/533; 528/12; 528/34
[58] Field of Search .............. 528/26, 27, 34, 528/12; 525/476, 533

[56] References Cited

U.S. PATENT DOCUMENTS

| | | | |
|---|---|---|---|
| 3,284,398 | 11/1966 | Warren et al. | 260/30.4 |
| 3,839,280 | 10/1974 | Zdaniewski. | |
| 4,038,338 | 7/1977 | Baumann et al. | 260/824 EP |
| 4,178,274 | 12/1979 | Denk et al. | 260/31.8 E |
| 4,902,739 | 2/1990 | Ona et al. | 549/215 |

FOREIGN PATENT DOCUMENTS

| | | | |
|---|---|---|---|
| 0567079 | 11/1993 | European Pat. Off. . | |
| 60-69131 | 4/1985 | Japan | 528/27 |
| 60-124617 | 7/1985 | Japan | 528/27 |
| 0834326 | 5/1960 | United Kingdom | 528/27 |

OTHER PUBLICATIONS

JP 03–192151, Chem. Abstr. vol. 116, Ref. 42881g (1992).
JP 04–331254, Chem. Abstr. vol. 119, Ref. 50634f (1993).
JP 01–020226, Centr. Pat. Ind., Ref. 89–066577/09 (1989).
Centr. Pat. Ind., Ref. 92–029776/04 (1992).

*Primary Examiner*—Robert E. Sellers
*Attorney, Agent, or Firm*—Hill, Steadman & Simpson

[57] ABSTRACT

A casting resin system containing epoxyalkylsiloxane is provided for covering optoelectronic components. The casting resin system includes a resin constituent containing a mixture of epoxyalkylsiloxanes and cycloaliphatic epoxy resins. The casting resin system can be hardened with a polycarboxylic acid anhydride as a hardener component to form molding materials that are transparent and color-stable.

3 Claims, No Drawings

CASTING RESIN OF EPOXYALKYLSILOXANE, EPOXY RESIN AND ANHYRIDE

BACKGROUND OF THE INVENTION

The present invention relates generally to casting resins that are temperature-stable and color-stable. More specifically, the present invention relates to casting resins utilized for covering SMT-compatible optoelectronic components, such as optoelectronic multi-chip arrays.

U.S. Pat. No. 4,178,274 relates to transparent casting resins that are color-stable. They are preferably utilized for enveloping LEDs and SMT-compatible LEDs, which are referred to as TOPLEDs. These resins are only conditionally suitable for covering large-area components such as, for example, for covering the above-recited multi-chip arrays. Large-area coverings composed of the known resins exhibit cracks and adhesion problems that particularly occur after temperature shock treatment of after the soldering heat required for soldering. These problems can deteriorate the optical and/or electrical properties of the optoelectrical components.

Therefore, a need exists for an improved casting resin suitable for covering optoelectronic components that avoids the disadvantages of previous casting resins. The covering should be temperature-stable and color-stable to provide a longer service life. In particular, the molding material should withstand high continuous duty temperatures of 125° C. as well as the temperature stress resulting from the soldering process.

SUMMARY OF THE INVENTION

The present invention provides a casting resin system modified with siloxane that avoids the disadvantages of prior casting resins known for optoelectronic components. The resulting casting resins or the resin constituents (A) thereof are limpid and transparent. Furthermore, they can be stored several months at room temperature without significantly increasing their viscosity or without a reduction of the epoxy content. The casting resins also can be processed like traditional epoxy casting resins. The epoxyalkoxysiloxanes utilized pursuant to the present invention do not disadvantageously influence the chemistry or the reactivity of the epoxy resin.

The casting resin system of the present invention includes a resin constituent (A) containing approximately 5 to 95% by weight of epoxyalkylsiloxane and approximately 95 to 5% by weight of epoxy resin. To harden the resin constituent, the casting resin system includes a hardener constituent (B) containing at least one polycarboxylic acid anhydride.

In an embodiment, the epoxyalkylsiloxane is a condensation product of a silanol and an epoxyalkoxysilane. The silanol preferably has the general formula:

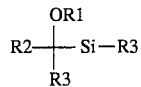

wherein R4 is alkyl or aryl; the radicals R5 are independently selected from OH or R4; and n is a whole number between 1 and 12 ($1 \leq n \leq 12$).

The epoxyalkoxysilane preferably has the general formula:

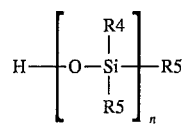

wherein R1 is an alkyl radical having from one to six carbon atoms or an aryl radical; R2 is a glycidyloxy alkyl, an epoxyalkyl or an epoxycycloalkyl radical; and the two radicals R3 are independently selected from OR1, R2, an alkyl or an aryl radical.

The present invention also provides a method for manufacturing a casting resin system. Initially, an epoxyalkoxysilane is condensed with a silanol to form an epoxy siloxane. The epoxy siloxane is then mixed with a cycloaliphatic or an aromatic epoxy resin in a weight ratio ranging from approximately 1:20 to 20:1. A hardener constituent including a polycarboxylic acid anhydride is provided to harden the casting resin system.

DETAILED DESCRIPTION OF THE PREFERRED EMBODIMENT

The molding materials obtainable by curing the epoxy resin system of the invention exhibit increased flexibility in comparison to siloxane-free molding materials due to the addition of the epoxyalkoxysilane but do not exhibit the disadvantages usually connected therewith. Thus, the glass transition temperature of the molding materials is only insignificantly lower than that of a siloxane-free comparison resin. The E-modulus also remains high, whereas the elastic behavior is improved. The thermal resistance is improved; this being particularly expressed in a lower thermal degradation rate and in a higher decomposition temperature. The molding materials are thereby clear and transparent. They exhibit high color stability and satisfy the required specifications in an intensified aging process.

An especially advantageous casting resin system contains a resin constituent (A) with approximately 5 to 95% by weight of epoxyalkylsiloxane. In the preferred embodiment, the epoxyalkylsiloxane is manufactured by condensation of an epoxyalkoxysilane (1) with a silanol (2):

(1)

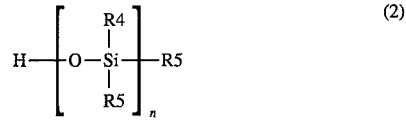
(2)

wherein R1 is an alkyl radical having from one to six carbon atoms or an aryl radical; R2 is a glycidyloxy alkyl, an epoxyalkyl or an epoxycycloalkyl radical; the two radicals R3 are independently selected from OR1, R2, an alkyl or an aryl radical; R4 is an alkyl or an aryl; the radicals R5 are independently selected from OH or R4; and n is a whole number between 1 and 12 ($1 \leq n \leq 12$).

This reaction to reproducible siloxane condensation products can be implemented in the shortest possible time in a simple single-pot reaction under normal atmospheric and pressure conditions and with minimum process outlay. The primary products are highly compatible with commercially obtainable epoxies and can be well-mixed in any ratio. Such mixtures are stable during storage and are crosslinkable with the carboxylic acid anhydrides standard for casting resin technology.

The epoxyalkoxysilane (1) carries one to three alkoxy groups capable of condensation. The radical R1 is arbitrary; preferably, however, it is an alkyl radical having one to six carbon atoms since the reactivity of the group to be split off in the condensation decreases with increasing chain length of the alkyl radical. The most reactive starting compounds are thus epoxymethoxysilanes (1). Since alcohol is split off in the condensation, ethyl can also be preferred as alkyl group R1 because of the safe nature of ethyl alcohol.

Monomeric epoxyalkoxysilanes (1) are preferred because of their simpler availability. However, the reaction is also fundamentally possible with correspondingly longer-chain alkoxysiloxanes.

Longer-chained silanols (2) that comprise the OH groups in alpha position, alpha and omega position or in the chain are more simply available and also more cost-beneficial. The selection of the further organic group R4 bonded via SiC is uncritical and can be an arbitrary alkyl or aryl radical.

The index n that defines the plurality of siloxane units can be freely selected between 1 and 12. Dependent on the other radicals, however, an increasing incompatibility of the condensation products (epoxyalkoxysilanes) can arise with increasing chain length. This incompatibility makes their employment more difficult or impossible in the casting resin system of the invention.

The radical R2 containing the epoxy group in the starting compound (1) is bonded to silicon via a carbon atom and is otherwise freely selectable. Dependent on the availability of the corresponding epoxyalkoxysilane, R2 can be a glycidyloxy alkyl group, an epoxyalkyl group, an epoxyaryl group or an epoxycycloalkyl group. The corresponding glycidyloxy compounds are easily available. These compounds are obtained by reaction of correspondingly reactive compounds with epichlorohydrin.

Dependent on the reactivity of the starting substances, which can be electronically and sterically inhibited, a condensation catalyst can be required for promoting the reaction. No restrictions derive for the catalyst in view of the reaction itself, so that any desirable condensation catalyst is suitable. The prerequisite, however, is that the catalyst does not influence the epoxy group and likewise does not deteriorate the storage behavior as well as the curing process of the casting resin system. An ideal catalyst therefore reacts neither decidedly basic nor decidedly acid, but instead is neutral.

The reaction of the starting substances (1) and (2) can be implemented in solution or as a bulk reaction.

Preferred reactionary temperatures lie between 80° C. and 150° C., whereby volatile reaction products in an open reaction vessel are preferably blown off by introducing an inert gas stream. Shelf life and stability of both the epoxyalkylsiloxane as well as of the casting resin system are thereby enhanced. Heating the resin constituent (A) in an applied vacuum enhances the shelf life stability of the casting resin system.

The condensation of (1) and (2) is preferably implemented approximately stoichiometrically. In this regard, approximately the same number of condensation-capable groups, i.e. hydroxide groups in the silanol (2) and alkoxy groups in (1), are available in both reaction participants.

The method for manufacturing the casting resin system of the invention is set forth in greater detail below with reference to the following examples.

EXAMPLE 1

Manufacture of the siloxane-modified resin constituent (A):

A 3-glycidyloxypropyltrimethoxysilane (GPT), known as an adhesion promoter for epoxy resins, is utilized as the alkoxysilane (1) (This compound is usually mixed with standard epoxy resins in a proportion of approximately 0.25%). α,ώ-propylphenyl silandiol (PPS) is selected as a suitable silanol (2).

11.8 g GPT (50 mMol) are mixed portion-by-portion with 57.8 g of PPS at 120° C. within 15 minutes. The quantity of silanol is dimensioned such that quantities of OH groups equivalent to the methoxy functions are available for the condensation. The solid PPS dissolves upon formation of methanol; high-viscosity siloxane condensate is formed. The reaction mixture is thereby stirred for a total of four hours at 120° C. upon simultaneous distilling of methanol as well as transfer of nitrogen. This condensate that contains methanol contains different siloxane products and is directly processed at 120° C. with the desired quantity of epoxy casting resin to form a storable siloxane-containing resin constituent.

To that end, an epoxyalkylsiloxane (siloxane condensate) produced in the above way is mixed in a differing mixing ratio With cycloaliphatic epoxy resin CY 179 (3,4-epoxy-cyclohexylmethyl-3',4'-epoxycyclohexane carboxylate, Ciba-Geigy).

For example, the viscosity at 60° C. as well as the epoxy value of a resin constituent composed of four parts siloxane condensate and one part CY 179 changes only slightly after being stored six months at 60° C. The viscosity thereby increases from 120 to 160 mPas and the epoxy value drops from 0.581 to 0.574 mol/100 g.

The following table recites some properties of the mixtures V1–V4 that are compared to the known, pure cycloaliphatic epoxy resin in test VO.

Characteristic data of the resin constituents:

|  | V0 | V1 | V2 | V3 | V4 |
|---|---|---|---|---|---|
| Epoxy value (mol/100 g) | 0.73 | 0.58 | 0.39 | 0.26 | 0.20 |
| Condensate part (%) | 0 | 20 | 50 | 70 | 80 |
| Viscosity η(60° C.) (mPas) | 40 | 120 | 240 | 5,800 | 7,000 |
| $n_D$ (20° C.) | 1.498 | 1.505 | 1.513 | 1.518 | 1.519 |
| Color | limpid, transparent | limpid, transparent | limpid, transparent | limpid, transparent | limpid, transparent |

EXAMPLE 2

Manufacture of a transparent molding material:

The content of cycloaliphatic epoxy resin defines the viscosity and the epoxy value and, thus, the workability of the resin constituent produced by mixing that, in conformity with its epoxy content, is compounded with a stoichiometric amount of the hardener constituent (B). The hardener constituent contains a polycarboxylic acid anhydride that can be partially esterified with an alkyl alcohol. Suitable anhydrides, for example, are (methyl-) tetrahydrophthalic acid anhydride or (methyl-) hexahydrophthallic acid anhydride. Hexahydrophthalic acid anhydride is selected for the exemplary embodiment. This anhydride being mixed with 13 parts by weight of the corresponding monoethylester per 100 parts by weight.

A metal complex catalyst, for example zinc octoat, is added to the casting resin system as an accelerator. However, other additives standard for casting resins can be added in slight amounts. For example, further possible accelerators are colorless metal chelate compounds. Specifically, Al, Zn or Zr with anions of organic acids, such as with acetate, acrylate, benzoate, salicylate, octoate or acetylacetonate are possible accelerators that may be utilized.

The curing, for example, is implemented at 150° C. and is completely ended after four hours. The higher thermal resistance of these molding materials is confirmed by TG/DTA experiments up to 800° C. A two-stage degradation mechanism is thereby observed. The degradation rate increases with increasing siloxane content and the respective pyrolysis residue as well as the combustion residue increases.

The molding materials are clear and transparent and all survived the solder bath test (being heated three times to 260° C. for respectively five seconds).

Glass transition temperatures $T_g$ and E-moduli are determined on the basis of solid, hardened parts of molding material.

Influence of the siloxane part on $T_g$ and on E-modulus:

|  | V0 | V1 | V2 | V4 |
|---|---|---|---|---|
| Condensate part (%) | 0 | 20 | 50 | 80 |
| E-Modulus (20° C.) (N/mmH2) | 2,800 | 2,750 | 2,500 | 2,200 |
| $T_\alpha(\tan\delta_{max})$ (°C.) | 177 | 170 | 153 | 99 |
| $\tan\delta(T_\alpha)$ | 0.976 | 0.855 | 0.654 | 0.601 |

The water absorption (7 days at 23° C.) is reduced in comparison to V0 for all inventively manufactured molding materials.

A multi-chip array covered with the casting resin of the invention is tested at operating temperatures of 125° C., is subjected in the interim to 100 temperature cycles from −55° through +125° C. and, finally, is subjected twice to the soldering conditions of five seconds each heated to 260° C. No cracks or other modifications whatsoever appear in the covering. The electrical and optical properties of the component are unvitiated.

The positive properties of the casting resin system of the invention are thereby achieved not only with the exemplary embodiment recited by way of example but are also achieved with arbitrary siloxane condensates as well as with arbitrary epoxy resins. Suitable casting resin systems can be compounded with aliphatic and aromatic glycidyl ethers, particularly on the basis of bisphenol-A and bisphenol-F, with corresponding glycidyl esters, aliphatic and cycloaliphatic epoxy resins or other arbitrary epoxides obtained, for example, by the epoxidation of unsaturated compounds.

Molding materials tinted with appropriate colorant also exhibit no color modification whatsoever even after months.

Understandably, various changes and modifications to the presently preferred embodiments described herein will be apparent to those skilled in the art. Such changes and modifications can be made without departing from the spirit and scope of the present invention and without diminishing its attendant advantages. Therefore, the appended claims are intended to cover such changes and modifications.

We claim:

1. A casting resin system containing epoxyalkylsiloxane comprising:

a resin constituent including approximately 5% to 95% by weight of an epoxyalkylsiloxane and approximately 95% to 5% by weight of an epoxy resin, the epoxyalkylsiloxane is a condensation product of an epoxyalkoxysilane having a general formula (1) and a silanol having a general formula (2) reacted in

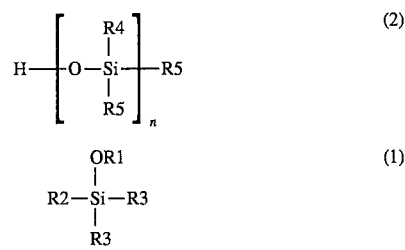

wherein R1 is an alkyl radical having one to six carbon atoms or an aryl radical; R2 is a glycidyloxy alkyl, an epoxyalkyl or an epoxycycloalkyl radical; and R3 are independently selected from OR1, R2, an alkyl, or an aryl radical; R4 is an alkyl or an aryl; R5 are independently selected from OH or R4; and n is a whole number with $1 \leq n \leq 12$; and a hardener constituent including at least one polycarboxylic acid anhydride.

2. The casting resin system of claim 1 wherein the polycarboxylic acid anhydride is selected from the group consisting of: aromatic and cycloaliphatic dicarboxylic acid anhydrides and aromatic tetracarboxylic acid anhydrides.

3. The casting resin system of claim 1 wherein the polycarboxylic acid anhydride is at least partially esterified with an alcohol.

* * * * *